US007031889B1

(12) United States Patent
McBride

(10) Patent No.: US 7,031,889 B1
(45) Date of Patent: Apr. 18, 2006

(54) METHOD AND APPARATUS FOR EVALUATING THE DESIGN QUALITY OF NETWORK NODES

(75) Inventor: John G McBride, Ft Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/273,784

(22) Filed: Mar. 22, 1999

(51) Int. Cl.
*G06F 17/50* (2006.01)
(52) U.S. Cl. .................................. 703/2; 703/13; 716/5
(58) Field of Classification Search .................... 703/2, 703/4, 13, 5; 716/5, 16, 4, 2, 7
See application file for complete search history.

(56) References Cited

U.S. PATENT DOCUMENTS

| 4,481,628 | A | * | 11/1984 | Pasquinelli ................. 714/745 |
|---|---|---|---|---|
| 4,806,801 | A | * | 2/1989 | Argade et al. ................ 326/71 |
| 5,050,091 | A | * | 9/1991 | Rubin ......................... 364/488 |
| 5,126,950 | A | * | 6/1992 | Rees et al. ................... 364/490 |
| 5,258,919 | A | * | 11/1993 | Yamanouchi et al. ....... 364/489 |
| 5,325,309 | A | * | 6/1994 | Halaviati et al. ............ 364/488 |
| 5,418,473 | A | * | 5/1995 | Canaris ........................ 326/27 |
| 5,446,674 | A | * | 8/1995 | Ikeda et al. .................. 364/489 |
| 5,493,508 | A | * | 2/1996 | Dangelo et al. ............. 364/489 |
| 5,586,046 | A | * | 12/1996 | Feldbaumer et al. ........ 364/490 |
| 5,666,288 | A | * | 9/1997 | Jones et al. .................. 364/490 |
| 5,844,818 | A | * | 12/1998 | Kochpatcharin et al. .... 364/578 |
| 5,883,814 | A | * | 3/1999 | Luk et al. ....................... 716/2 |
| 5,936,868 | A | * | 8/1999 | Hall .............................. 716/4 |
| 5,987,237 | A | * | 11/1999 | McBride ................. 395/500.01 |
| 6,055,366 | A | * | 4/2000 | Le et al. ................. 395/500.06 |
| 6,077,717 | A | * | 6/2000 | McBride ....................... 438/10 |
| 6,175,946 | B1 | * | 1/2001 | Ly et al. ......................... 716/4 |
| 6,260,180 | B1 | * | 7/2001 | McBride ........................ 716/5 |
| 6,470,489 | B1 | * | 10/2002 | Chang et al. .................. 716/21 |
| 6,499,129 | B1 | * | 12/2002 | Srinivasan et al. ............ 716/4 |
| 6,591,402 | B1 | * | 7/2003 | Chandra et al. ............... 716/5 |

OTHER PUBLICATIONS

Provisional U.S. Appl. No. 60/093,830 for the US patent No. 6,499,129 B1 issued to Srinivasan et al., on Dec. 2002.*

* cited by examiner

*Primary Examiner*—Thai Phan

(57) ABSTRACT

A method and apparatus for evaluating the design quality of an integrated circuit design. The design to be evaluated comprises a plurality of static gates, such as, for example, NAND and NOR gates. The apparatus of the present invention comprises a computer configured to execute a rules checker program. The rules checker program analyzes each of the static gates to determine whether or not the gates meet acceptable noise immunity requirements. In order to perform this task, the rules checker program constructs models of each gate. The models emphasize or de-emphasize the strengths of certain FETs of the gate in response to noise on inputs to the gate for different logic states of the inputs. For each model, the rules checker program obtains a PFET-to-NFET width ratio. These ratios are utilized to obtain noise levels from a lookup table. Noise levels on the inputs to the gate are derived, either by calculation or simulation. These derived noise levels are then compared with the noise levels obtained from the lookup table to determine whether or not the gate being evaluated meets acceptable noise immunity requirements.

20 Claims, 7 Drawing Sheets

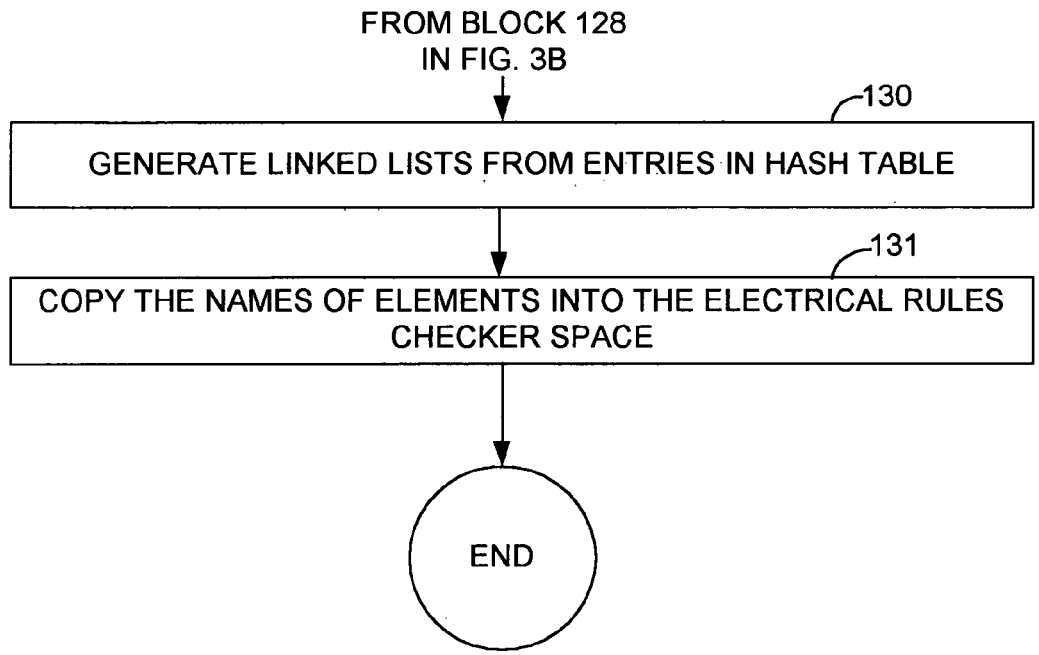
FIG. 3C
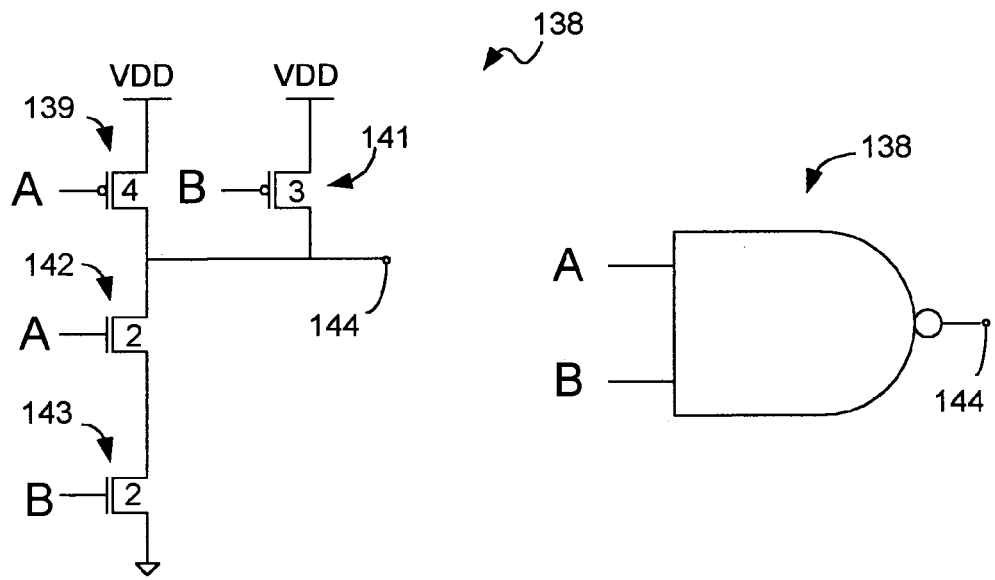
FIG. 4A
FIG. 4B

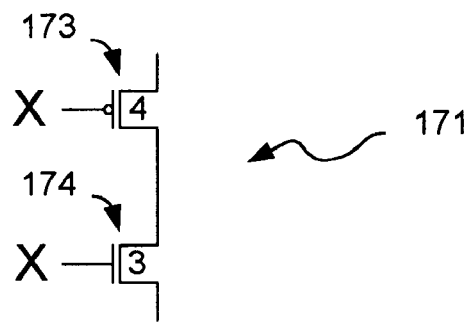
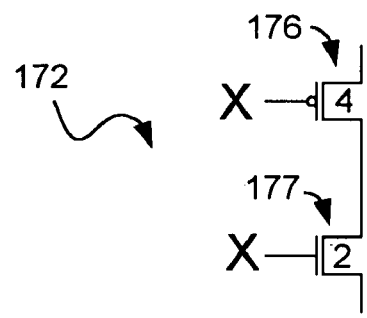
FIG. 8A  FIG. 8B
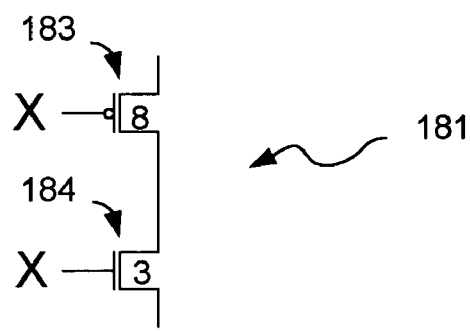
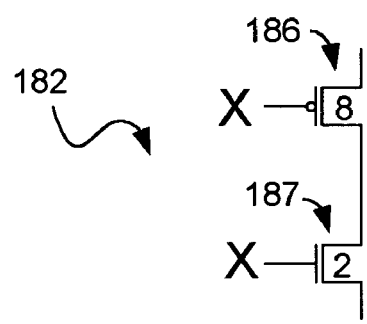
FIG. 9A  FIG. 9B

METHOD AND APPARATUS FOR EVALUATING THE DESIGN QUALITY OF NETWORK NODES

TECHNICAL FIELD OF THE INVENTION

The present invention generally relates to computer-aided circuit design systems and, more particularly, to a method and apparatus for evaluating static gates in an integrated circuit to determine whether or not the gates meet acceptable noise immunity requirements.

BACKGROUND OF THE INVENTION

Integrated circuits are electrical circuits comprised of transistors, resistors, capacitors, and other components comprised on a single semiconductor "chip" in which the components are interconnected to perform a given function. Typical examples of integrated circuits include, for example, microprocessors, programmable logic devices (PLDs), electrically erasable programmable memory devices (EEPROMs), random access memory-devices (RAMs), operational amplifiers and voltage regulators. A circuit designer typically designs the integrated circuit by using very large scale integrated (VLSI) circuit design techniques to create a circuit schematic which indicates the electrical components and their interconnections. Often, designs are simulated by computer to verify functionality and to ensure that performance goals are satisfied.

In the world of electrical device engineering, the design and analysis work involved in producing electronic devices is often performed using electronic computer aided design (E-CAD) tools. As will be appreciated by those skilled in the art, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules" which are used repetitively throughout the larger circuit. A flat netlist will contain multiple copies of the circuit modules, including all of the components within the modules. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems identify certain critical timing paths, and then evaluate the circuit to determine whether timing violations may occur through the critical paths. As is known, timing specifications may be provided to such systems by way of a configuration file.

One such system known in the prior art is marketed under the name PathMill, by EPIC Design Technology, Inc., subsequently purchased by Synopsis, Inc. PathMill is a transistor-based analysis tool used to find critical paths and to verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. One primary shortcoming of the PathMill program is that it does not analyze the circuits to determine the design quality of the circuits. Rather, PathMill performs a static timing analysis of a circuit using the netlist provided to PathMill. Furthermore, configuring PathMill to recognize various circuit characteristics is typically a very difficult task.

Accordingly, a need exists for a rules checking system that will allow circuits to be evaluated for design quality. The present invention provides a method and apparatus for building a database relating to a circuit to be evaluated and for utilizing the database in conjunction with a rules checking system to determine the design quality of the circuit. The present invention works in conjunction with a tool such as PathMill to build the database of the present invention. Typically, such tools, including PathMill, receive a netlist and use the netlist to determine FET (field effect transistor) direction, node types, latches, dynamic gates, rise and fall times, etc. This information can be utilized by the present invention to build a database which can then be utilized by the rules checking system to determine design quality of FET-level circuits designed in accordance with VLSI techniques. In accordance with the present invention, the rules checking system evaluates the design quality of an integrated circuit to determine whether or not static gates of the integrated circuit meet acceptable noise immunity requirements.

SUMMARY OF THE INVENTION

The present invention provides a method and apparatus for evaluating a gate of an integrated circuit to determine whether or not the gate has acceptable immunity to noise. The apparatus comprises a computer configured to execute a rules checker program which receives input relating to characteristics of a static gate contained in the integrated circuit. The gate comprises at least two field effect transistors (FETs). Each FET has a width and the characteristics received in the input to the rules checker program include the widths of the field effect transistors. The rules checker program analyzes the widths of the FETs to determine whether or not the gate has an acceptable noise immunity.

Each gate typically comprises a plurality of N FETs and P FETs and input terminals for receiving input signals. The rules checker program processes the widths of the P FETs and N FETs to obtain at least a first numerical value relating to the widths. The rules checker program utilizes the first numerical value to access one or more threshold noise level values from a memory device in communication with the computer. The rules checker program determines noise levels on the inputs, either through calculation or simulation. The rules checker program compares the determined noise levels with the threshold values and uses the results of the comparison to determine whether or not the gate has an acceptable immunity to noise.

Other features and advantages of the present invention will become apparent from the following description, drawings and claims.

DESCRIPTION OF THE DRAWINGS

FIGS. 3A–3C together form a flow chart which illustrates the method of the present invention for generating the database of the present invention which can be utilized by a rules checking program to perform rules checking tasks.

FIG. 4A is a schematic diagram of a NAND gate to be evaluated by the rules checking program of the present invention.

FIG. 4B is a block diagram of the NAND gate shown in FIG. 4A.

FIG. 8A is a first model of the NOR gate shown in FIG. 6A wherein the NOR gate shown in FIG. 7A has been approximated by a circuit containing a single PFET and a single NFET.

FIG. 8B is a second model of the NOR gate shown in FIG. 7A wherein the NOR gate shown in FIG. 6A has been approximated by a circuit containing a single PFET and a single NFET.

FIG. 9A is a model of the NOR gate shown in FIGS. 7A and 7B, wherein the model has been generated by summing the widths of the PFETs and NFETs into a single PFET and a single NFET.

FIG. 9B is a model of the NOR gate shown in FIGS. 7A and 7B, wherein the model is generated by choosing the sum of the widths of the PFETs receiving input B (of NOR gate 163) and the sum of the widths of the NFETs receiving input B.

DETAILED DESCRIPTION OF THE PRESENT INVENTION

Figure 1:
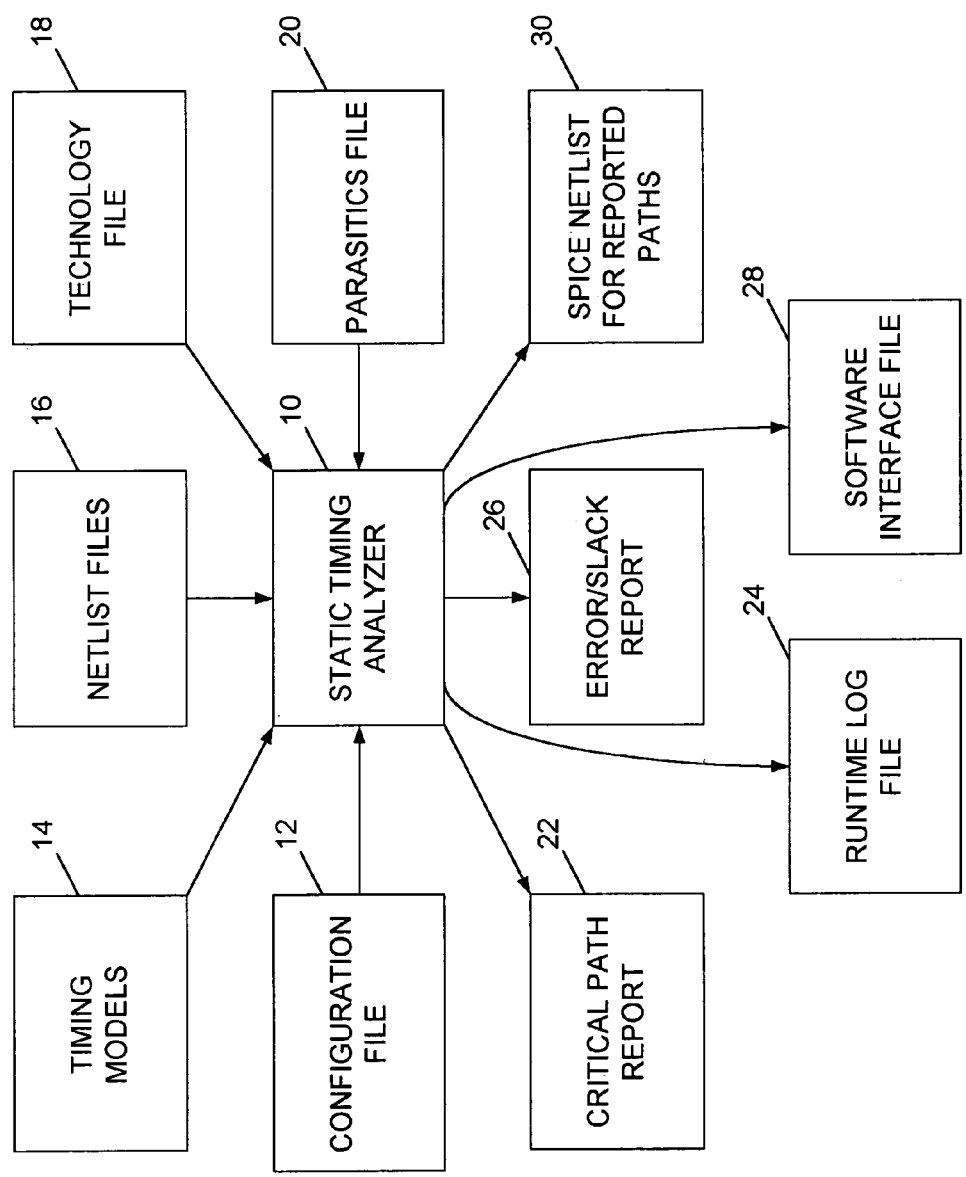
FIG. 1 is a block diagram of a static timing analyzer system, as is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as static timing analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitic file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration file(s) 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their interrelations.

Figure 2:
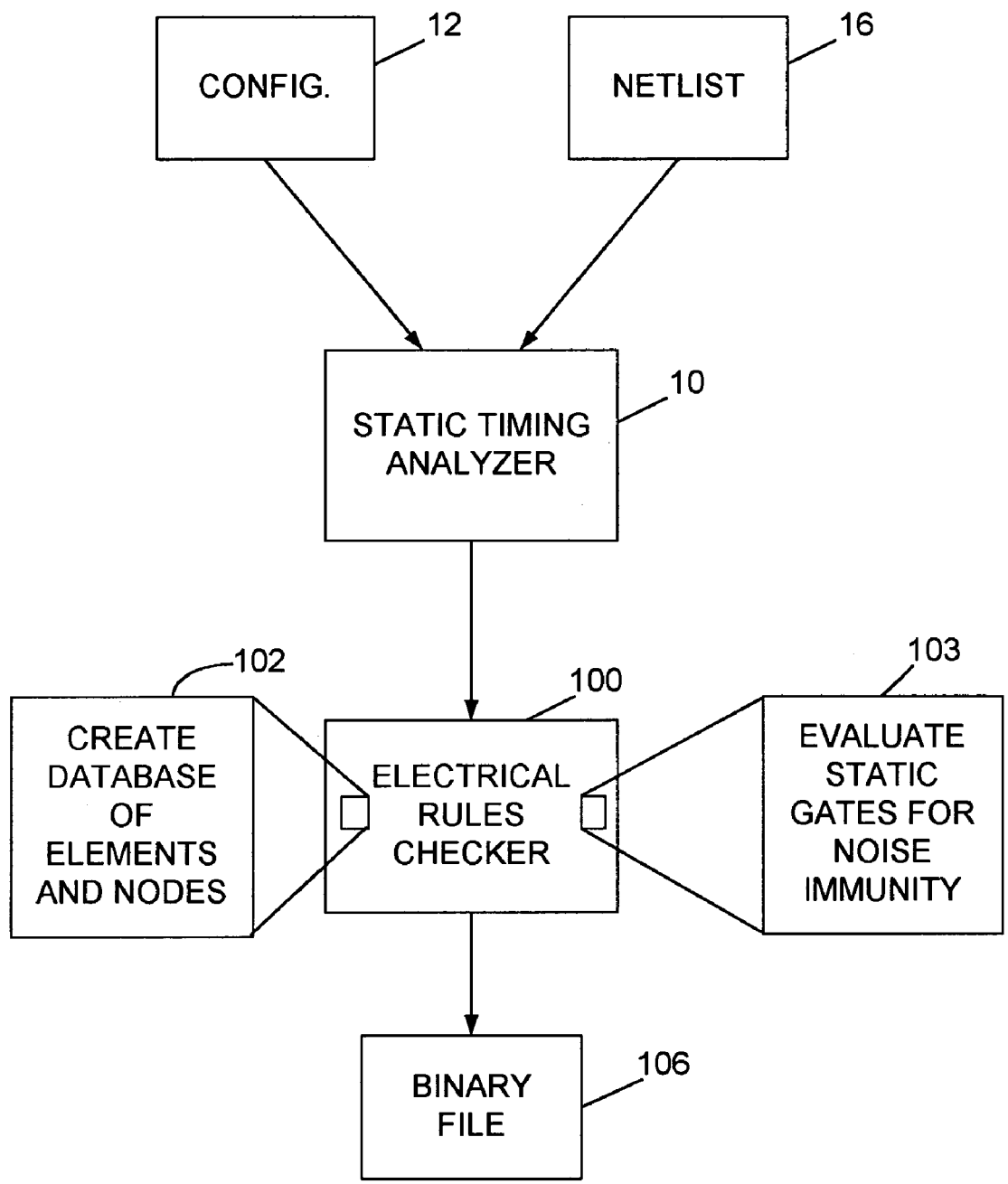
FIG. 2 is a block diagram illustrating the orientation of the electrical rules checking method of the present invention, in relation to an existing static timing analyzer.

The system shown in FIG. 2 preferably utilizes a computer (not shown) for its operation which runs the static timing analyzer program 10 and the electrical rules checker program 100. The computer may be electrically coupled to a memory device (not shown) which functions as a system storage unit for storing the code and data utilized and/or generated by the system. Those skilled in the art will realize that the present invention is not limited to any particular type of computer or memory device for performing these functions.

It should also be noted that the term "computer", as that term is used herein, is intended to denote any machine capable of performing the calculations, or computations, necessary to perform the tasks of the present invention. In essence, this includes any machine that is capable of accepting a structured input and of processing the input in accordance with prescribed rules to produce an output. Furthermore, those skilled in the art will understand that the system shown in FIG. 2 may be implemented in hardware, software, or a combination of both, and is not limited to any particular physical, structural, or electrical configuration.

The electrical rules checker 100 program of the present invention is preferably configured to operate on an output of the static timing analyzer 10. In this regard, the static timing analyzer may be configured to generate an output netlist database, which the electrical rules checker 100 of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. For example, a portion of the electrical rules checker program 100 operates to identify NOR gates and NAND gates within an integrated circuit design. This is only one example of the multitude of checks which may be performed by the electrical rules checker program 100 of the present invention.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker 100 of the present invention provides an excellent mechanism for double-checking designs and design layouts. Furthermore, the electrical rules checker 100 of the present invention may generate an output binary file 106, which may ultimately be used in subsequent executions of the electrical rules checker 100.

However, prior to the electrical rules checker 100 of the present invention performing any of the rules checking tasks, a database of nodes and elements of the circuit to be evaluated is generated. This database is then utilized by the electrical rules checker 100 of the present invention to perform the rules checking tasks. The rules checker program 100 generates the database, as indicated by block 102, and then utilizes the database to evaluate the noise immunity of static gates in the integrated circuit, as indicated by block 103.

The manner in which this database is generated will now be discussed below with respect to FIGS. 3A–3C. For purposes of illustration, it will be assumed that the static timing analyzer 10, shown in FIG. 2 and discussed above, is the PathMill static timing analyzer, in order to provide an example of one possible implementation of the present invention. However, those skilled in the art will understand that the electrical rules checker 100 of the present invention and the database of the present invention are not limited to use with any particular program.

The PathMill static timing analyzer provides an application program interface (API) which allows the PathMill static timing analyzer to communicate with the electrical rules checker 100 of the present invention. This API allows code external to the PathMill program to be linked to the PathMill program so that the external code and the PathMill program itself comprise one executable which can be run as a single program. The electrical rules checker 100 of the present invention utilizes this API to obtain information from the PathMill static timing analyzer which can be utilized by the electrical rules checker 100 to generate the database of the present invention, as indicated by block 102.

Prior to the database of the present invention being generated, the PathMill program runs and identifies circuit characteristics of the circuit under consideration such as, for example, FET direction, node types, latches, dynamic gates, clocks, rise and fall times, etc. Before the PathMill program terminates, it calls the electrical rules checker 100 of the present invention. The PathMill program has a feature commonly referred to as "hooks", which allows the PathMill program to call routines at various stages of execution. Once the PathMill program has finished identifying the characteristics mentioned above, the PathMill program calls the electrical rules checker 100 of the present invention. The electrical rules checker 100 of the present invention, through this series of subroutine calls, creates its own database of the circuit under consideration.

Figure 3A:
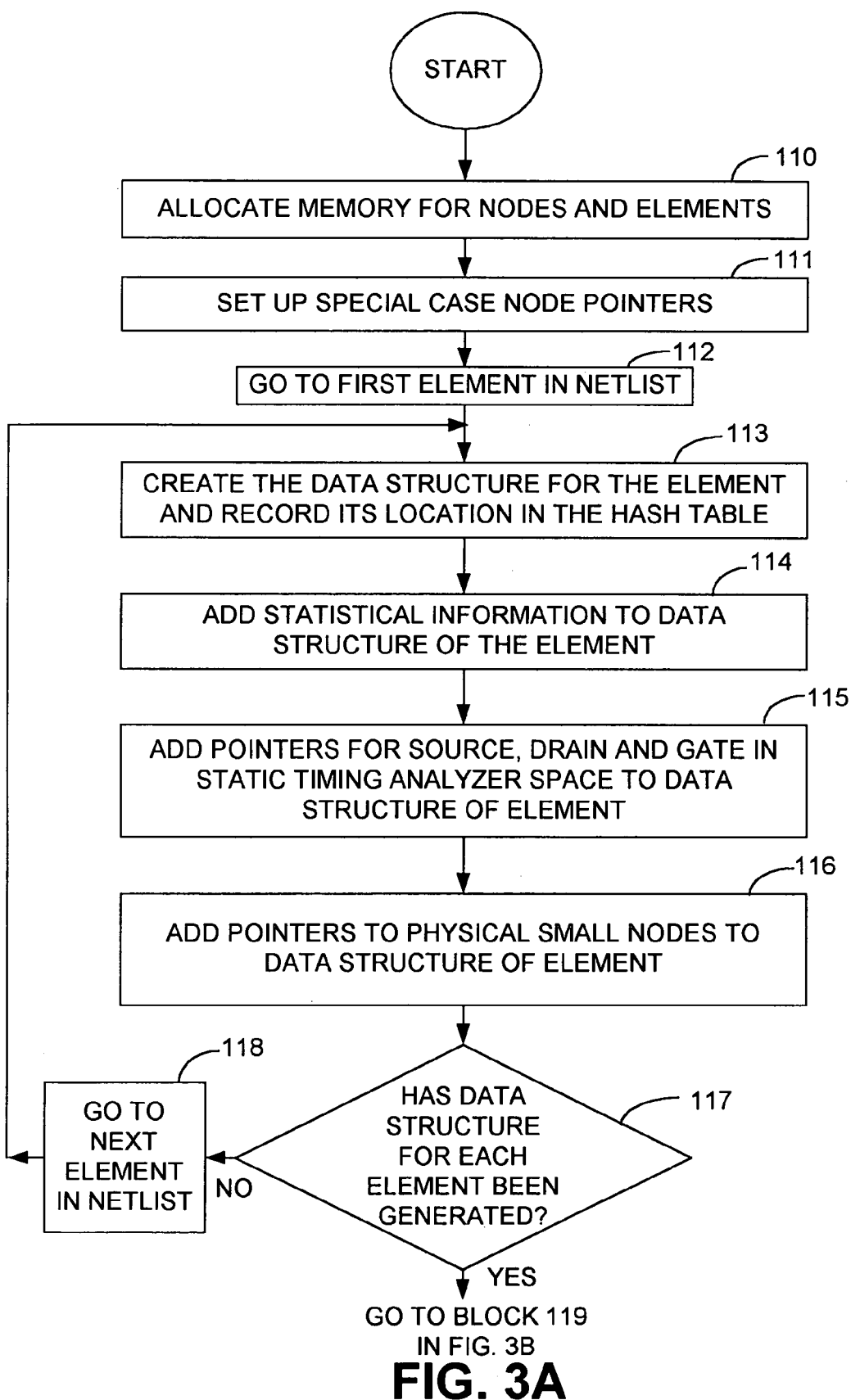
Figure 3B:
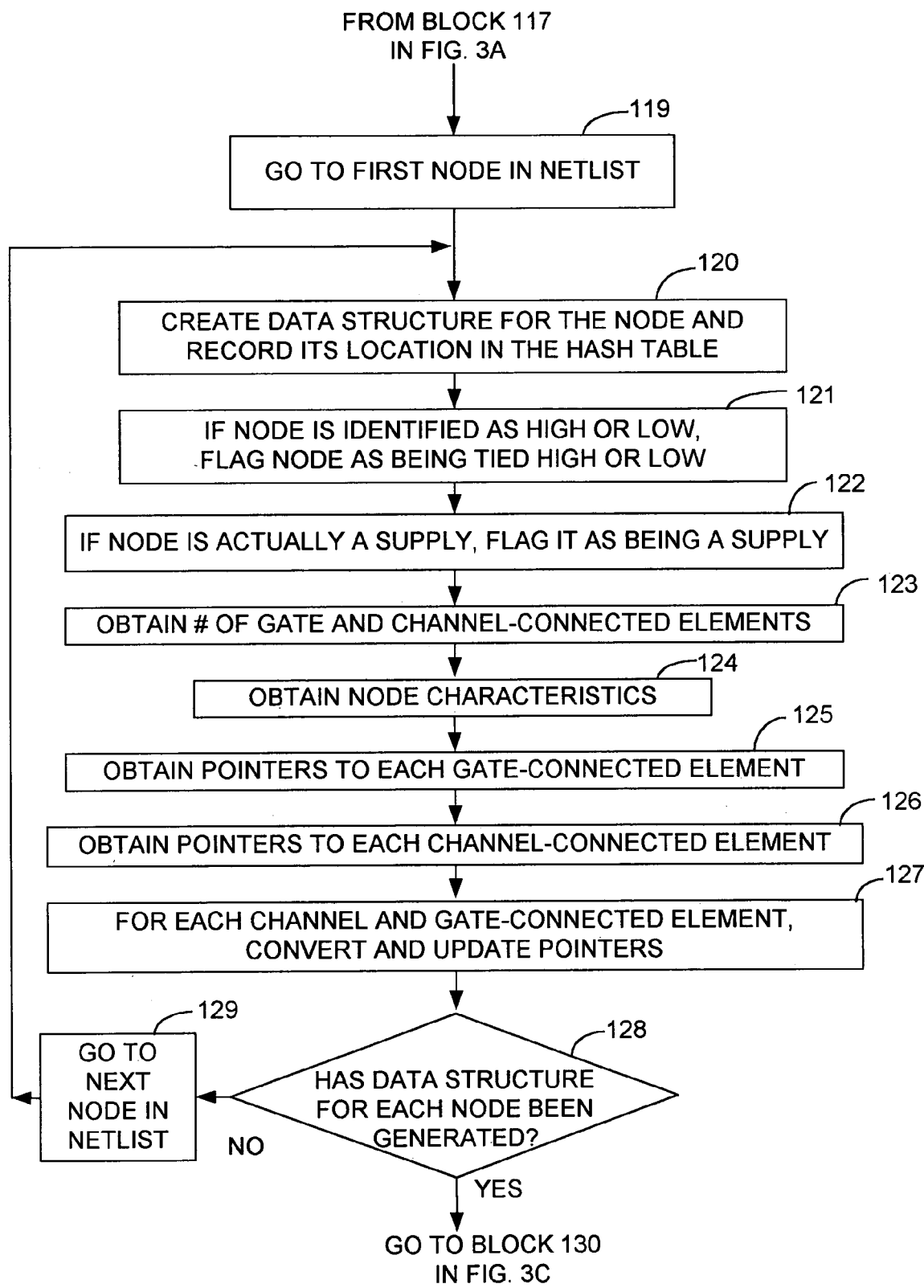

The first step in the process of generating the database is to allocate memory for the nodes and elements of the circuit, as indicated by block 110 in FIG. 3A. The PathMill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing memory allocation on the number of nodes and elements in the circuit, it may be desirable to distinguish between different types of nodes and elements so that memory can be more efficiently allocated. However, it will be apparent to those skilled in the art that the present invention is not limited with respect to the manner in which memory space is allocated for the nodes and elements. Those skilled in the art will understand the manner in which the memory allocation task, and any optimizations of it, can be performed. Therefore, in the interest of brevity, a detailed discussion of the memory allocation task for the nodes and elements will not be provided herein.

Once memory has been allocated for the nodes and elements, the next step in building the database is to set up node pointers for special cases of nodes, as indicated by block 111. These special types of nodes will be used repeatedly during the process of generating the database, as discussed below in more detail. Therefore, the pointers for these nodes preferably are set up relatively early in the database generation process. For example, nodes which correspond to the supplies (GND and VDD) are special types of nodes and it is helpful to set up node pointers for these types of nodes. This is done by finding the nodes whose names match the known names of the supply nodes.

For each element, a data structure must be generated which can be utilized by the electrical rules checker 100 in performing the rules checking tasks. Steps 113–116 in FIG.

3A correspond to the steps for creating the element data structures. The first element for which a data structure must be generated is obtained during the step represented by block 112. The data structure for that element is then generated and the location of the data structure is recorded in a hash table, as indicated by block 113. This step is performed so that the element pointers into the space of the static timing analyzer can be used later to look up the element data structures in the space of the electrical rules checker 100. Hash tables and the manner in which they are utilized are well-known in the art. Therefore, a detailed discussion of the manner in which the pointers into the space of the static timing analyzer are converted using the hash table into pointers into the space of the electrical rules checker 100 will not be provided herein since persons skilled in the art will understand the manner in which this can be accomplished.

Statistical information relating to the element is then added to the data structure of the element, as indicated by block 114. This information includes, for example, the width of the element, the length of the element, the direction of the element, and the element type. Once the statistical information has been included in the data structure of the element, the pointers for the source, drain and gate of the element, as defined in the space of the static timing analyzer, are included in the data structure of the element, as indicated by block 115. The pointers that were set up in step 111 are utilized in step 115. If either the source, drain or gate of the element is attached to ground or VDD, then the pointers for the source, drain and gate are set to the pointers for ground or VDD obtained in step 111.

A circuit and the nodes of the circuit can be represented logically or physically, or as a combination of both. A logical representation of a circuit primarily comprises FETs and does not include any resistors for representing parasitic resistance of the interconnect material. The logical representation of a node is identified in the PathMill program as a "supernode". On the other hand, a physical representation of a node, which is identified in the PathMill program as a "small node", includes FETs, but also includes resistors, which correspond to the parasitic resistance in the node. Therefore, in the physical representation, a small node exists between the resistors representing the parasitic resistance and between any FET and any one of the resistors. In the physical representation, FETs may be connected to different small nodes whereas in the logical representation, those same FETs may be connected to the same supernode.

Each element has a pointer to a supernode and to a small node for each drain, source and gate. Therefore, there are six pointers for each FET. Each small node in the physical representation maps to one particular supernode in the logical representation. In block 116, the pointers corresponding to these small nodes are added to the data structure of the element. A determination is then made at block 117 as to whether or not data structures for all of the elements have been generated. If not, the next element in the netlist is obtained, as indicated by block 118, and the process returns to block 113. If so, the process proceeds to block 119 in FIG. 3B.

Once the data structures for the elements have been generated, the data structures for the nodes are generated. Blocks 120–127 in FIG. 3B correspond to the steps in the process of the present invention for generating the data structures of the nodes. The first node for which the data structure is to be generated is obtained at the step represented by block 119. The data structure for the node is then generated and the location of the data structure is recorded in the hash table, as indicated by block 120.

For the purpose of design quality analysis, it is important to distinguish actual supply nodes, such as VDD and GND, from other circuit nodes which have been declared to be tied high or low for the purpose of timing or other analysis. In block 121, the rules checker 100 determines, through the use of PathMill API calls, which nodes have been declared to be tied high or low, or are actually high or low because they are actual supply nodes. The rules checker 100 flags the actual high nodes as high and the actual low nodes as low in the step represented by block 121. In the step represented by block 122, the nodes which are actually supplies are flagged as supplies in the database.

The electrical rules checker 100 then obtains the number of gate-connected elements and the number of channel-connected elements from the static timing analyzer, as indicated by block 123. The electrical rules checker 100 also obtains the characteristics of the nodes from the static timing analyzer 10, as indicated by block 124. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 125. The electrical rules checker 100 then obtains the pointers from the static timing analyzer which point to each channel-connected element, as indicated by block 126.

The element pointers that are stored in the node during the steps represented by blocks 125 and 126 are pointers into the space of the static timing analyzer. Similarly, the node pointers that are stored in the element during the step represented by block 115 are pointers into the space of the static timing analyzer, except that the pointers to the VDD and GND nodes are stored as pointers to the VDD and GND nodes in the space of the electrical rules checker 100. In the step represented by block 127, some of these pointers are converted to point to the elements and nodes in the space of the electrical rules checker 100. For each of the gate-connected and channel-connected elements of the current node, the following steps are performed, which are represented by block 127:

(1) the element pointer is converted to the corresponding element pointer into the space of the electrical rules checker 100 by looking it up in the hash table. This element pointer replaces the original element pointer in the node structure;

(2) the source, gate, and drain pointers in the element data structure are each checked to see if they point to the current node. If so, the node pointer (into the space of the static timing analyzer) is replaced with the pointer to the current node in the space of the electrical rules checker.

A determination is then made at block 128 as to whether or not data structures for all of the nodes have been generated. If not, the next node in the netlist is obtained, as indicated by block 129, and the process returns to block 120.

In order to enable the electrical rules checker 100 to maximize efficiency in searching the database of the present invention, once the data structures for all of the nodes have been created, linked lists of elements and nodes preferably are generated from the entries in the hash table, as indicated by block 130 in FIG. 3C. These lists are used by the electrical rules checker 100 of the present invention is searching for an element in the database. The electrical rules checker 100 simply analyzes the elements contained in the linked list when searching for an element.

It should be noted that the arrangement of the elements and nodes in the linked lists may or may not have any physical relationship to the arrangement of the elements and nodes in the circuit under consideration. Thus, the linked lists are merely used to search through the elements and nodes stored in the database.

Once the linked lists have been generated, the names of the elements and nodes contained in the linked list are copied into electrical rules checker space, as indicated by block 131. This reduces the number of calls that need to be made to the PathMill program by the electrical rules checker 100. Once the database of the present invention has been generated, no more calls have to be made to the PathMill program via the PathMill API. The database of the present invention is comprised as the binary file 106 shown in FIG. 2.

Once the database of the present invention has been generated in the manner described above, the electrical rules checker 100 of the present invention utilizes this database to perform the rules checking tasks. Specifically, the electrical rules checker 100 evaluates the static gates in the integrated circuit to determine whether or not noise immunity requirements are met.

FIG. 4A is a schematic diagram of the NAND gate 138 shown in the block diagram of FIG. 4B. The NAND gate 138 comprises two PFETs 139 and 141 and two NFETs 142 and 143. Each PFET and each NFET of NAND gate 138 has a predetermined width. The widths of the PFETs and NFETs are directly proportional to the strengths of the PFETs and NFETs (i.e., to the driving capability of the NFETs and PFETs), as will be understood by those skilled in the art. The NAND gate 138 has two inputs, namely, input A and input B. The NAND gate 138 has an output at terminal 144 of the NAND gate 138.

When either or both of the inputs A and B are low, the output of the NAND gate 138 at terminal 144 will be high. When both of the inputs A and B are low, the output of the NAND gate 138 will be high. Noise, or glitches, occurring on either or both of the inputs A and/or B of the NAND gate 138 can cause the NAND gate 138 to produce an erroneous output signal at output terminal 144. Whether or not the NAND gate 138 will react to the glitch on the input in such a way that an erroneous result is produced at the output terminal 144 of the gate depends on the susceptibility of the NAND gate 138 to noise. As will be understood by those skilled in the art, the widths, and thus the strengths, of the FETs affect the susceptibility of the NAND gate 138 to noise.

In accordance with the present invention, the rules checker program 100 models the circuit shown in FIG. 4A in a plurality of ways and then obtains ratios of the widths of the PFETs to the NFETs in the models. These ratios are used by the rules checker 100 to obtain respective noise levels from a lookup table contained in a memory device (not shown) which is in communication with the computer executing the rules checker program 100. The NAND gate 138 is then simulated and the voltage noise on inputs A and B is calculated for different logic values of inputs A and B. Those skilled in the art will understand the manner in which the voltage noise is derived through calculation. Therefore, a detailed discussion of the manner in which the voltage noise is derived through calculation will not be provided herein in the interest of brevity.

As an alternative to calculating the voltage noise, the NAND gate 138 may be simulated using a simulation program, such as Spice, for example, and the voltage noise on inputs A and B may be measured. The manner in which the voltage noise can be derived using a simulation routine will also be understood by those skilled in the art.

This derived voltage noise level is then compared to the voltage noise levels obtained from the lookup table. If the derived noise levels are below the noise levels for the models obtained from the lookup table, the rules checker 100 determines that the NAND gate 138 meets acceptable noise immunity requirements. If the derived noise levels are greater than the noise levels obtained from the lookup table, the rules checker program 100 determines that the NAND gate 138 does not meet acceptable noise immunity requirements. A notification may be provided to a user to notify the user that the noise immunity requirements have not been met. This allows the user to generate a new design which meets acceptable noise immunity requirements.

Figure 5A:
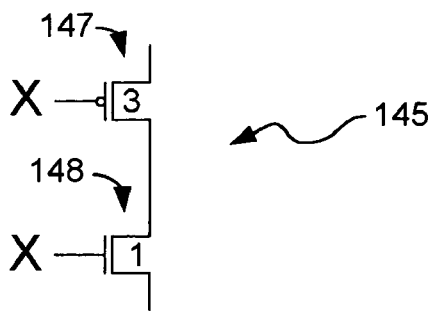
FIG. 5A is a first model of the NAND gate shown in FIG. 4A wherein the NAND gate of FIG. 4A has been approximated by a circuit comprising a single PFET and a single NFET.

In accordance with the preferred embodiment of the present invention, four different models are generated for the gate being evaluated. The electrical rules checker 100 generates a first model 145 shown in FIG. 5A which is most susceptible to noise when the inputs A and B are both low due to the relatively small width of the PFET utilized in model 145. For the first model, the electrical rules checker 100 utilizes the smallest of the PFET widths, 3, for the width of PFET 147. The rules checker 100 utilizes the effective width for the series NFETs. The effective width is calculated by the following equation:

$$1(1/w_1 + 1/w_2) \qquad \text{Equation (1)}$$

where $w_1$ is the width of NFET 142 and $w_2$ is the width of NFET 143. Using Equation (1), the effective width of the NFET 148 in FIG. 5A is 1.

Figure 5B:
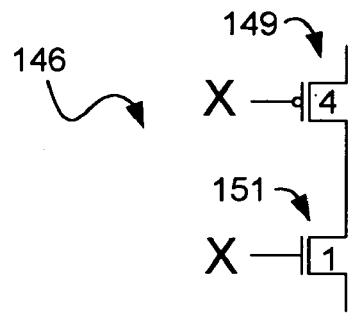
FIG. 5B is a second model of the NAND gate shown in FIG. 4A wherein the NAND gate shown in FIG. 4A has been approximated by a circuit comprising a single PFET and a single NFET.

The electrical rules checker 100 generates the second model 146 shown in FIG. 5B which is most susceptible to noise when the inputs A and B are both high due to the relatively large width of the PFET utilized in model 146. The second model 146 is generated by choosing the largest of the PFET widths of gate 138, which is 4, as the width of PFET 149. The width of the NFET 151 of model 146 is equal to the effective width obtained by using Equation (1), which is 1. Model 145 will be less susceptible to noise than model 146 when the inputs A and B have certain logic levels and more susceptible to noise than model 146 when inputs A and B have other logic values. As stated above, model 145 will be most susceptible to noise when the inputs A and B are both low and model 146 will be most susceptible to noise when the inputs A and B are both high.

Figure 6A:
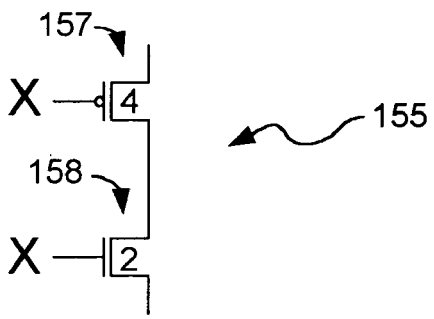
FIG. 6A is a third model of the NAND gate shown in FIG. 4A wherein the NAND gate of FIG. 4A has been approximated by a circuit comprising a single PFET and a single NFET.
Figure 6B:
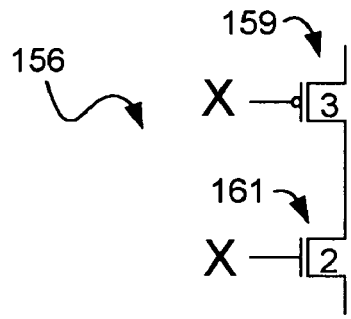
FIG. 6B is a fourth model of the NAND gate shown in FIG. 4A wherein the NAND gate of FIG. 4A has been approximated by a circuit comprising a single PFET and a single NFET.

It is possible that one or both of the models 145 and 146 will be less susceptible to noise than the NAND gate 138. In order to ensure that this possibility is accounted for, the models 155 and 156 of FIGS. 6A and 6B, respectively, are utilized. The model 155 shown in FIG. 6A is generated by first obtaining the sum of the widths of the PFETs receiving input A in NAND gate 138 and the sum of the widths of the NFETs receiving input A in NAND gate 138. These values are then assigned to the PFET 157 and to the NFET 158 of model 155. Obviously, since there is only one PFET and one NFET receiving input A in the exemplary NAND gate 138, the values in the model 155 coincide with these values.

The model 156 is generated by first obtaining the sum of the widths of the PFETs receiving input B in NAND gate 138 and the sum of the widths of the NFETs receiving input B in NAND gate 138. These values are then assigned to the PFET 159 and to the NFET 161 of model 156. Since there is only one PFET and one NFET receiving input B in the exemplary NAND gate 138, the values in the model 156 coincide with these values Once the models have been constructed, the rules checker 100 derives the voltage noise levels on the inputs A and B. The PFET-to-NFET ratio for model 145, which is 3-to-1, is used to look up noise levels in the lookup table. The ratio corresponds to two values in the lookup table, namely, a first value which corresponds to the maximum allowed noise level when inputs A and B are low and a second value which corresponds to the maximum allowed noise level when the inputs A and B are high. The derived noise levels are then compared to the values read from the lookup table. If the derived noise levels are less than, or less than or equal to, depending on how the algorithm is implemented, the values read from the lookup table, then the derived noise levels are acceptable with respect to model 145.

The inputs A and B are first set high and the noise levels on the inputs are derived. The inputs A and B are then set low and the noise levels on the inputs are derived. All of these noise levels are then compared with the noise levels read out of the lookup table and if the derived noise levels are less than, or less than or equal to, the corresponding values read out of the lookup table, the rules checker 100 determines that the NAND gate has acceptable noise immunity with respect to model 145.

The PFET-to-NFET ratio for model 146, which is 4-to-1, is used to lookup two noise levels in the lookup table. The derived noise levels when both A and B are high and when both A and B are low are then compared to the values read from the lookup table. If the derived noise levels are less than, or less than or equal to, depending on how the algorithm is implemented, the values read from the lookup table, then the derived noise levels are acceptable with respect to model 146. In accordance with one embodiment, if the derived noise levels are acceptable with respect to model 145 and model 146, then the rules checker program 100 determines that the NAND gate 138 meets acceptable noise immunity requirements.

In order to account for the situation where one of the models 145 or 146 is actually less susceptible to noise than the NAND gate 138, models 155 and 156 may be utilized. For model 155, input A set high and the noise level on input A is derived. Input A is then set low and the noise level is derived on input A. The PFET-to-NFET ratio is then used to obtain two noise levels from the lookup table, namely, a maximum allowed noise level when input A is low and a maximum allowed noise level when input A is high. If the derived noise levels are less than, or less than or equal to, the stored values, depending on the manner in which the algorithm is implemented, the rules checker 100 determines that the NAND gate 138 meets acceptable noise immunity requirements with respect to model 155.

For model 156, input B is set high and the noise level on input B is derived. Input B is then set low and the noise level on input B is derived. The PFET-to-NFET ratio of model 156 is then used to obtain the corresponding noise levels from the lookup table. If the derived noise levels are less than the stored values, or less than or equal to the stored values, depending on the manner in which the algorithm is implemented, the rules checker 100 determines that the NAND gate 138 meets acceptable noise immunity requirements with respect to model 156.

If, for all of the models, the derived noise levels are less than, or less than or equal to, the values contained in the lookup table, the rules checker 100 determines that the NAND gate meets acceptable noise immunity requirements.

It should be noted that it is not critical that the models 155 and 156 be utilized in evaluating the noise immunity of the gate since, in most cases, the models 145 and 146 will be more susceptible to noise than the gate being evaluated. Therefore, noise susceptibility can be evaluated, in most cases, without the need for utilizing the models 155 and 156.

In accordance with another embodiment of the present invention, the rules checker 100 obtains the largest and the smallest PFET-to-NFET ratio of all of the models 145, 146, 155 and 156. This will result in two ratios, i.e., a smallest PFET-to-NFET ratio and a largest PFET-to-NFET ratio. The rules checker 100 will utilize the largest ratio to obtain a first value from a first lookup table and the smallest ratio to obtain a second value from a second lookup table. The voltage noise on inputs A and/or B will then be calculated for certain logic states of inputs A and/or B depending on which of the model ratios are being utilized.

For example, if model 145 results in the largest ratio, the voltage noise on both of the inputs A and B will be calculated (or otherwise derived) when both inputs are high and these noise levels will be compared with the corresponding noise level read out of the lookup table. Similarly, if the smallest ratio corresponds to model 155, input A will be set low and the voltage noise level on input A will be calculated and compared to the corresponding value read out of the lookup table. Input B will then be set low and the voltage noise level on input B will be calculated and compared to the corresponding value read out of the lookup table. If, in all of these cases, the calculated noise levels are less than (or less than or equal to) the values read out of the lookup tables, the rules checker 100 will determine that the NAND gate 138 meets acceptable noise immunity requirements.

Assuming that model 146 corresponds to the largest ratio and model 156 corresponds to the smallest ratio, the noise levels on inputs A and B will be calculated when the inputs A and B are both high. This value will then be compared to the corresponding values read out of the lookup table. Similarly, the noise level on input B will be calculated when input B is low and this noise level will be compared with the noise levels read out of the lookup table. The noise level on input A will then be calculated when input A is low and this noise level will be compared with the noise levels read out of the lookup table If, in all of these cases, the calculated noise levels are less than (or less than or equal to) the noise levels read out of the lookup tables, the rules checker 100 will determine that the NAND gate meets acceptable noise immunity requirements.

Figure 7A:
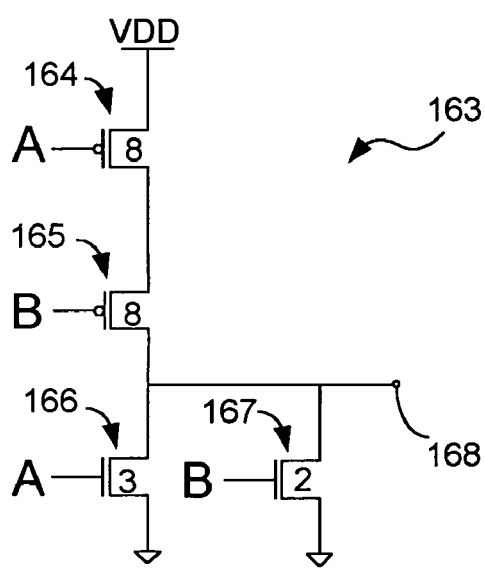
FIG. 7A is a schematic diagram of a NOR gate to be evaluated by the rules checking program of the present invention.
Figure 7B:
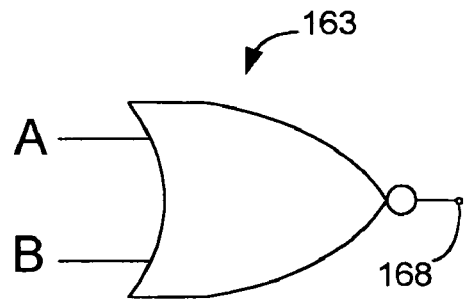
FIG. 7B is a block diagram of the NOR gate shown in FIG. 7A.

FIG. 7A is a schematic block diagram of the NOR gate 163 shown in FIG. 7B in block diagram form. The NOR gate 163 comprises two PFETs 164 and 165, which are in series, and two NFETs 166 and 167, which are in parallel. The inputs A and B are applied to the PFETs and to the NFETs, as shown. The NOR gate 163 has an output terminal 168. When either or both of the inputs A and B are high, the output at terminal 168 will be low. When both of the inputs A and B are low, the output at terminal 168 will be high. As with the NAND gate 138 discussed above, a glitch on one or both of the inputs A and/or B can cause an erroneous output at output terminal 168.

In order to evaluate the NOR gate 163 for noise susceptibility, the electrical rules checker 100 generates the models 171, 172, 181 and 182 shown in FIGS. 8A, 8B, 9A and 9B, respectively. In order to generate the model 171, the electrical rules checker 100 obtains the smallest effective width for the PFETs 164 ad 165. The electrical rules checker 100 utilizes Equation (1) to obtain the effective width for the PFET 163 shown in FIG. 8A. Using this equation, the width of the PFET 163 shown in FIG. 8A will be 4. In order to obtain the value of for the width of the NFET 174 shown in FIG. 7A, the electrical rules checker 100 simply utilizes the largest of the widths of the NFETs 166 and 167 shown in FIG. 7A. Therefore, the width of the NFET 174 shown in FIG. 8A will be 3.

In order to obtain the model 172 shown in FIG. 8B, the PFET 176 is assigned a width equal to the effective width of the series PFETs 164 and 165 shown in FIG. 7A. Therefore, in this example, using Equation (1), the width of the PFET 176 will be 4. In order to obtain the value of the width of the NFET 177 shown in FIG. 8B, the electrical rules checker 100 chooses the smallest of the widths of the parallel NFETs 166 and 167 shown in FIG. 7A. This results in a width of 2 for the NFET 177 shown in FIG. 8B.

The model 181 shown in FIG. 9A is generated by obtaining the sum of the widths of the PFETs receiving input A in NOR gate 163 and the sum of the widths of the NFETs receiving input A in NOR gate 163. These values are then assigned to the PFET 183 and to the NFET 184 of model 181. The model 182 is generated by choosing the sum of the widths of the PFETs receiving input B in NOR gate 163 and the sum of the widths of the NFETs receiving input B in NOR gate 163. These values are then assigned to the PFET 186 and to the NFET 187 of model 182.

Once the models have been constructed, the rules checker 100 derives the voltage noise on the inputs A and B. The rules checker 100 derives the noise levels on inputs A and B when inputs A and B are both high and when inputs A and B are both low. The PFET-to-NFET ratio for model 171, which is 4-to-3, is used to look up two noise levels in the lookup table, which correspond to the maximum allowable noise when inputs A and B are both high and when inputs A and B are both low. The derived noise levels are then compared to the values read from the lookup table. If the derived noise levels are less than, or less than or equal to, depending on how the algorithm is implemented, the values read from the lookup table, then the measured noise level is acceptable with respect to model 171.

The PFET-to-NFET ratio for model 172, which is 4-to-2, is used to lookup the two corresponding noise levels in the lookup table. The derived noise levels are then compared to the values read from the lookup table. If the derived noise levels are less than, or less than or equal to, depending on how the algorithm is implemented, the values read from the lookup table, then the derived noise levels are acceptable with respect to model 172. In accordance with one embodiment, if the derived noise levels are acceptable with respect to model 171 and model 172, then the rules checker program 100 determines that the NOR gate 163 meets acceptable noise immunity requirements.

In order to account for the situation where one of the models 171 or 172 is actually less susceptible to noise than the NOR gate 163, models 181 and 182 may be utilized. For model 181, input A is set high and the noise level on input A is derived. Input A is then set low and the noise level on input A is derived. The PFET-to-NFET ratio is then used to obtain the two corresponding noise levels from the lookup table. If the derived noise levels are less than the stored values, or less than or equal to the stored values, depending on the manner in which the algorithm is implemented, the rules checker 100 determines that the NOR gate 163 meets acceptable noise immunity requirements with respect to model 181.

For model 182, input B is set high and the noise level on input B is derived. Input B is then set low and the noise level on input B is derived. The PFET-to-NFET ratio of model 182 is then used to obtain the two corresponding noise levels from the lookup table. If the derived noise levels are less than the stored values, or less than or equal to the stored values, depending on the manner in which the algorithm is implemented, the rules checker 100 determines that the NOR gate 163 meets acceptable noise immunity requirements with respect to model 182.

If, in all these cases, the derived noise levels obtained are less than, or less than or equal to, the values contained in the lookup table, the rules checker 100 determines that the NOR gate 163 meets acceptable noise immunity requirements.

It should be noted that it is not critical that the models 181 and 182 be utilized in evaluating the noise immunity of the gate since, in most cases, the models 171 and 172 will be more susceptible to noise than the gate being evaluated. Therefore, noise susceptibility can be evaluated, in most cases, without the need for utilizing the models 181 and 182.

In accordance with another embodiment of the present invention, the rules checker 100 obtains the largest and the smallest PFET-to-NFET ratio of all of the models 171, 172, 181 and 182. This will result in two ratios, i.e., a smallest PFET-to-NFET ratio and a largest PFET-to-NFET ratio. The rules checker 100 will utilize the largest ratio to obtain a first value from a first lookup table and the smallest ratio to obtain a second value from a second lookup table. The voltage noise on inputs A and/or B will then be calculated for certain logic states of inputs A and/or B depending on which of the model ratios are being utilized.

For example, if model 171 results in the largest ratio, the voltage noise on both of the inputs A and B will be calculated (or otherwise derived) when both inputs are high and these noise levels will be compared with the corresponding noise levels read out of the lookup table. Similarly, if the smallest ratio corresponds to model 181, input A will be set low and the voltage noise level on input A will be calculated and compared to the corresponding value read out of the lookup table. Input B will then be set low and the voltage noise level on input B will be calculated and compared to the corresponding value read out of the lookup table. If, in all of these cases, the derived noise levels are less than (or less than or equal to) the values read out of the lookup table, the rules checker 100 will determine that the NOR gate 163 meets acceptable noise immunity requirements.

Assuming that model 172 corresponds to the largest ratio and model 182 corresponds to the smallest ratio, the noise levels on inputs A and B will be calculated when the inputs A and B are both high. This value will then be compared to the value read out of the lookup table which corresponds to the ratio for model 172. Similarly, the noise level on input B will be calculated when input B is low and this noise level will be compared with the noise level read out of the lookup table. The noise level on input A will be calculated when input A is low and this noise level will be compared with the noise level read out of the lookup table. If, in all of these cases, the calculated noise levels are less than (or less than or equal to) the noise levels read out of the lookup table, the rules checker 100 will determine that the NOR gate 163 meets acceptable noise immunity requirements.

It should be noted that the methods for generating and utilizing the models discussed above is not limited to any particular types of static gates. These methods apply to all types of static gates, e.g., ANDs, ORs, NANDs, NORs, XORs, XNORs, etc., as well as inverters and complex gates. With respect to all of these gates, Equation (1) is utilized to obtain effective widths for series PFETs and series NFETs. Models are then set up using the effective widths and the largest and smallest NFETs and PFETs in the manner discussed above with respect to FIGS. 4A–9B. Those skilled in the art will understand the manner in which the methods discussed above can be utilized to generate the models and to utilize them to evaluate the noise immunity of the gates. Therefore, in the interest of brevity, a detailed discussion of the manner in which the methods of the present invention can be utilized with each different type of static gate will not be discussed herein.

The foregoing description is not intended to be exhaustive or to limit the invention to the precise forms disclosed. Those skilled in the art will understand that modifications or variations are possible in light of the above teachings, which are within the scope of the present invention. In this regard, the embodiment discussed above was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention.

What is claimed is:

1. An apparatus for evaluating a gate to determine whether or not the gate has an acceptable immunity to noise, the apparatus comprising:
a computer configured to execute a rules checker program, the rules checker program receiving input relating to characteristics of a static gate contained in the integrated circuit, the gate comprising at least two field effect transistors, each field effect transistor having a width, the characteristics including the widths of the field effect transistors, the rules checker program analyzing the widths of the field effect transistors to determine whether or not the gate has an acceptable noise immunity.

2. The apparatus of claim 1, wherein the gate comprises at least one N field effect transistor and at least one P field effect transistor, the gate comprising at least first and second input terminals for receiving respective first and second input signals, the rules checker program processing the widths of the P field effect transistor and of the N field effect transistor to obtain a first numerical value relating to the widths, the rules checker program utilizing the first numerical value to access first and second threshold values stored in a memory device in communication with the computer, the rules checker program determining noise levels on the inputs, the rules checker program comparing the determined noise levels with the threshold values read out of the memory device and using the results of the comparison to determine whether or not the gate has an acceptable immunity to noise.

3. The apparatus of claim 2, wherein the rules checker program generates a first model of the gate in order to process the widths of the P and N field effect transistors, the first representation of the gate consisting of a single N field effect transistor and a single P field effect transistor, the rules checker program obtaining a first ratio of the width of the P field effect transistor of the first model to the width of the N field effect transistor of the first model, the first ratio corresponding to the first numerical value used by the rules checker program to access the first and second threshold values stored in the memory device, wherein when the first and second inputs are high, the rules checker program determines noise levels on the first and second inputs and compares the determined noise levels to the first and second threshold values to determine whether or not the gate meets acceptable noise immunity requirements with respect to the first model, wherein if the rules checker program determines that the gate meets acceptable noise immunity requirements with respect to the first model, the rules checker program determines that the gate has an acceptable immunity to noise.

4. The apparatus of claim 3, wherein the rules checker program processes the widths of the P and N field effect transistors by generating a second model of the gate, the second model of the gate consisting of a single N field effect transistor and a single P field effect transistor, the rules checker program obtaining a second ratio of the width of the P field effect transistor of the second model to the width of the N field effect transistor of the second model, the second ratio corresponding to a second numerical value, the second numerical value being used by the rules checker program to access a third and fourth threshold values stored in the memory device, wherein the rules checker program determines noise levels on the first and second inputs when the first and second inputs are low and compares the determined noise levels to the third and fourth threshold values to determine whether or not the gate meets acceptable noise immunity requirements with respect to the second model, wherein if the rules checker program determines that the gate meets acceptable noise immunity requirements with respect to the first and second models, the rules checker program determines that the gate has an acceptable noise immunity.

5. The apparatus of claim 4, wherein the rules checker program processes the widths of the P and N field effect transistors by generating a third model of the gate, the third model of the gate consisting of a single N field effect transistor and a single P field effect transistor, the rules checker program obtaining a third ratio of the width of the P field effect transistor of the third model to the width of the N field effect transistor of the third model, the third ratio corresponding to a third numerical value, the third numerical value being used by the rules checker program to access a fifth and sixth threshold values stored in the memory device, wherein when the first input is high, the rules checker program determines the noise level on the first input and compares the determined noise level to the fifth threshold value, wherein when the first input is low, the rules checker program determines the noise level on the first input and compares the determined noise level to the sixth threshold value, wherein the results of the comparisons are used by the rules checker program to determine whether or not the gate meets acceptable noise immunity requirements with respect to the third model, wherein if the rules checker program determines that the gate meets acceptable noise immunity requirements with respect to the first, second and third models, the rules checker program determines that the gate has an acceptable noise immunity.

6. The apparatus of claim 5, wherein the rules checker program processes the widths of the P and N field effect transistors by generating a fourth model of the gate, the fourth model of the gate consisting of a single N field effect transistor and a single P field effect transistor, the rules checker program obtaining a fourth ratio of the width of the P field effect transistor of the fourth model to the width of the N field effect transistor of the fourth model, the fourth ratio corresponding to a fourth numerical value, the fourth numerical value being used by the rules checker program to access seventh and eighth threshold values stored in the memory device, wherein when the second input is low, the rules checker program determines the noise level on the second input and compares the determined noise level to the seventh threshold value, wherein when the second input is high, the rules checker program determines the noise level on the second input and compares the determined noise level to the eighth threshold value, the rules checker program using the results of the comparisons to determine whether or not the gate meets acceptable noise immunity requirements with respect to the fourth model, wherein if the rules checker program determines that the gate meets acceptable noise immunity requirements with respect to the first, second, third and fourth models, the rules checker program determines that the gate has an acceptable noise immunity.

7. The apparatus of claim 1, wherein the gate comprises at least one N field effect transistor and at least one P field effect transistor, the gate comprising at least first and second input terminals for receiving respective first and second input signals, wherein the rules checker program generates first, second, third and fourth models of the gate in order to process the widths of the P and N field effect transistors, the first, second, third and fourth models of the gate each consisting of a single N field effect transistor and a single P field effect transistor, the rules checker program obtaining a first ratio of the width of the P field effect transistor of the first model to the width of the N field effect transistor of the first model, the rules checker program obtaining a second ratio of the width of the P field effect transistor of the second model to the width of the N field effect transistor of the second model, the rules checker program obtaining a third ratio of the width of the P field effect transistor of the third model to the width of the N field effect transistor of the third model, the rules checker program obtaining a fourth ratio of the width of the P field effect transistor of the fourth model to the width of the N field effect transistor of the fourth model, wherein the rules checker program utilizes the largest and the smallest of all of the ratios to obtain first, second, third and fourth threshold values, respectively, from a memory device, the first and second threshold values corresponding to the largest of the ratios, the third and fourth threshold values corresponding to the smallest of the ratios, the threshold values being compared to noise levels on the inputs to determine whether or not the gate meets acceptable noise immunity requirements.

8. A method for evaluating a gate to determine whether or not the gate has an acceptable immunity to noise, the method comprising the steps of:
receiving input in a computer relating to characteristics of a static gate contained in the integrated circuit, the gate comprising at least two field effect transistors, each field effect transistor having a width, the characteristics including the widths of the field effect transistors; and
analyzing the widths of the field effect transistors in the computer to determine whether or not the gate has an acceptable noise immunity, wherein the computer executes a rules checker program which analyzes the widths to determine whether or not the gate has an acceptable noise immunity.

9. The method of claim 8, wherein the gate comprises at least one N field effect transistor and at least one P field effect transistor, the gate comprising at least first and second input terminals for receiving respective first and second input signals, the analyzing step being performed by the rules checker program further comprising the steps of:
processing the widths of the P field effect transistor and of the N field effect transistor to obtain at least a first numerical value relating to the widths;
utilizing the first numerical value to access first and second threshold values stored in a memory device in communication with the computer;
determining noise levels on the input terminals; and
comparing the determined noise levels with the threshold values read out of the memory device and using the results of the comparison to determine whether or not the gate has an acceptable immunity to noise.

10. The method of claim 9, wherein the processing step includes the step of generating a first model of the gate in order to process the widths of the P and N field effect transistors, the first model of the gate consisting of a single N field effect transistor and a single P field effect transistor, the rules checker program obtaining a first ratio of the width of the P field effect transistor of the first model to the width of the N field effect transistor of the first model, the first ratio corresponding to the first numerical value used by the rules checker program to access the first and second threshold values stored in the memory device, wherein the rules checker program determines noise levels on the first and second inputs when the first and second inputs are high and compares the determined noise levels to the first and second threshold values, respectively, to determine whether or not the gate meets acceptable noise immunity requirements with respect to the first model, wherein if the rules checker program determines that the gate meets acceptable noise immunity requirements with respect to the first model, the rules checker program determines that the gate has an acceptable immunity to noise.

11. The method of claim 10, wherein the processing step further includes the step of generating a second model of the gate, the second model of the gate consisting of a single N field effect transistor and a single P field effect transistor, the rules checker program obtaining a second ratio of the width of the P field effect transistor of the second model to the width of the N field effect transistor of the second model, the second ratio corresponding to a second numerical value, the second numerical value being used by the rules checker program to access third and fourth threshold values stored in the memory device, wherein the rules checker program determines noise levels on the first and second inputs when the first and second inputs are low and compares the determined noise levels to the third and fourth threshold values, respectively, to determine whether or not the gate meets acceptable noise immunity requirements with respect to the second model, wherein if the rules checker program determines that the gate meets acceptable noise immunity requirements with respect to the first and second models, the rules checker program determines that the gate has an acceptable noise immunity.

12. The method of claim 11, wherein the wherein the processing step further includes the step of generating a third model of the gate, the third model of the gate consisting of a single N field effect transistor and a single P field effect transistor, the rules checker program obtaining a third ratio of the width of the P field effect transistor of the third model to the width of the N field effect transistor of the third model, the third ratio corresponding to a third numerical value, the third numerical value being used by the rules checker program to access fifth and sixth threshold values stored in the memory device, wherein the rules checker program determines the noise level on the first input when the first input is high and compares the determined noise level to the fifth and sixth threshold values, and wherein the rules checker program determines the noise level on the second input when the second input is high and compares the determined noise level to the fifth and sixth threshold values, the results of the comparison operations being used by the rules checker program to determine whether or not the gate meets acceptable noise immunity requirements with respect to the third model, wherein if the rules checker program determines that the gate meets acceptable noise immunity requirements with respect to the first, second and third models, the rules checker program determines that the gate has an acceptable noise immunity.

13. The method of claim 12, wherein the wherein the processing step further includes the step of generating a fourth model of the gate, the fourth model of the gate consisting of a single N field effect transistor and a single P field effect transistor, the rules checker program obtaining a fourth ratio of the width of the P field effect transistor of the fourth model to the width of the N field effect transistor of the fourth model, the fourth ratio corresponding to a fourth numerical value, the fourth numerical value being used by the rules checker program to access seventh and eighth threshold values stored in the memory device, wherein the rules checker program determines the noise level on the second input when the second input is low and compares the determined noise levels to the seventh and eighth threshold values, and wherein the rules checker program determines the noise level on the first input when the first input is low and compares the determined noise levels to the seventh and eighth threshold values, the rules checker program using the results of the comparison operations to determine whether or not the gate meets acceptable noise immunity requirements with respect to the fourth model, wherein if the rules checker program determines that the gate meets acceptable noise immunity requirements with respect to the first, second, third and fourth models, the rules checker program determines that the gate has an acceptable noise immunity.

14. The method of claim 9, wherein the processing step includes the step of generating first, second, third and fourth models of the gate in order to process the widths of the P and N field effect transistors, the first, second, third and fourth models of the gate each consisting of a single N field effect transistor and a single P field effect transistor, wherein during the processing step the rules checker program obtains first, second, third and fourth ratios, the first ratio corresponding to a ratio of the width of the P field effect transistor of the first model to the width of the N field effect transistor of the first model, the first ratio corresponding to the first numerical value, the second ratio corresponding to a ratio of the width of the P field effect transistor of the second model to the width of the N field effect transistor of the second model, the third ratio corresponding to a ratio of the width of the P field effect transistor of the third model to the width of the N field effect transistor of the third model, the fourth ratio corresponding to a ratio of the width of the P field effect transistor of the fourth model to the width of the N field effect transistor of the fourth model, wherein during the utilizing step the rules checker program utilizes the largest and the smallest of all of the ratios to obtain the first, second, third and fourth threshold values from the memory device, the first and second threshold values corresponding to the largest of the ratios, the third and fourth threshold values corresponding to the smallest of the ratios, the threshold values being compared to noise levels on the inputs of the gate for particular logic states, the results of the comparison operations being utilized by the rules checker program to determine whether or not the gate meets acceptable noise immunity requirements.

15. A computer-readable medium containing a rules checker computer program, the computer program evaluating a gate to determine whether or not the gate has an acceptable immunity to noise, the gate comprising at least two field effect transistors, each field effect transistor having a width, the characteristics including the widths of the field effect transistors, the program comprising:

code which analyzes the widths of the field effect transistors to determine whether or not the gate has an acceptable noise immunity.

16. The computer-readable medium of claim 15, wherein the gate comprises at least one N field effect transistor and at least one P field effect transistor, the gate comprising at least first and second input terminals for receiving respective first and second input signals, the code comprising:

a first code segment which processes the widths of the P field effect transistor and of the N field effect transistor to obtain a first numerical value relating to the widths;

a second code segment which utilizes the first numerical value to access first and second threshold values stored in a memory device in communication with the computer;

a third code segment which determines noise levels on the input terminals; and a fourth code segment which compares the determined noise levels with the threshold values read out of the memory device and uses the results of the comparison to determine whether or not the gate has an acceptable immunity to noise.

17. The computer-readable medium of claim 16, wherein the first code segment includes model generating code which generates a first model of the gate in order to process the widths of the P and N field effect transistors, the first model of the gate consisting of a single N field effect transistor and a single P field effect transistor, the model generating code obtaining a first ratio of the width of the P field effect transistor of the first model to the width of the N field effect transistor of the first model, the first ratio corresponding to the first numerical value used by the second code segment to access the first and second threshold values stored in the memory device, wherein when the first and second inputs are high, the third code segment determines noise levels on the first and second inputs and wherein the fourth code segment compares the determined noise levels to the first and second threshold values to determine whether or not the gate meets acceptable noise immunity requirements with respect to the first model, wherein if the fourth code segment determines that the gate meets acceptable noise immunity requirements with respect to the first model, the program determines that the gate has an acceptable immunity to noise.

18. The computer-readable medium of claim 17, wherein the model generating code generates a second model of the gate, the second model of the gate consisting of a single N field effect transistor and a single P field effect transistor, the model generating code obtaining a second ratio of the width of the P field effect transistor of the second model to the width of the N field effect transistor of the second model, the second ratio corresponding to a second numerical value, the second numerical value being used by the second code segment to access a third and fourth threshold values stored in the memory device, wherein the third code segment determines noise levels on the first and second inputs when the first and second inputs are low and wherein the fourth code segment compares the determined noise levels to the third and fourth threshold values to determine whether or not the gate meets acceptable noise immunity requirements with respect to the second model, wherein if the fourth code segment determines that the gate meets acceptable noise immunity requirements with respect to the first and second models, the program determines that the gate has an acceptable noise immunity.

19. The computer-readable medium of claim 18, wherein the model generating code generates a third model of the gate, the third model of the gate consisting of a single N field effect transistor and a single P field effect transistor, the model generating code obtaining a third ratio of the width of the P field effect transistor of the third model to the width of the N field effect transistor of the third model, the third ratio corresponding to a third numerical value, the third numerical value being used by the second code segment to access fifth and sixth threshold values stored in the memory device, wherein when the first input is high, the third code segment determines the noise level on the first input and wherein the fourth code segment compares the determined noise level to the fifth threshold value, and wherein when the first input is low, the third code segment determines the noise level on the first input and wherein the fourth code segment compares the determined noise level to the sixth threshold value, the fourth code segment using the results of the comparison operations to determine whether or not the gate meets acceptable noise immunity requirements with respect to the third model, wherein if the fourth code segment determines that the gate meets acceptable noise immunity requirements with respect to the first, second and third models, the program determines that the gate has an acceptable noise immunity.

20. The computer-readable medium of claim 19, wherein the model generating code generates a fourth model of the gate, the fourth model of the gate consisting of a single N field effect transistor and a single P field effect transistor, the model generating code obtaining a fourth ratio of the width of the P field effect transistor of the fourth model to the width of the N field effect transistor of the fourth model, the fourth ratio corresponding to a fourth numerical value, the fourth numerical value being used by the second code segment to access seventh and eighth threshold values stored in the memory device, wherein when the second input is low, the third code segment determines the noise level on the second input and wherein the fourth code segment compares the measured noise level to the seventh threshold value, and wherein when the second input is high, the third code segment determines the noise level on the second input and wherein the fourth code segment compares the measured noise level to the eighth threshold value, the fourth code segment using the results of the comparison to determine whether or not the gate meets acceptable noise immunity requirements with respect to the fourth model, wherein if the fourth code segment determines that the gate meets acceptable noise immunity requirements with respect to the first, second, third and fourth models, the program determines that the gate has an acceptable noise immunity.

* * * * *

UNITED STATES PATENT AND TRADEMARK OFFICE
CERTIFICATE OF CORRECTION

| | |
|---|---|
| PATENT NO. | : 7,031,889 B1 |
| APPLICATION NO. | : 09/273784 |
| DATED | : April 18, 2006 |
| INVENTOR(S) | : John G McBride |

Page 1 of 1

It is certified that error appears in the above-identified patent and that said Letters Patent is hereby corrected as shown below:

In column 18, line 45, in Claim 12, after "claim 11, wherein the" delete "wherein the".

In column 19, line 3, in Claim 13, after "claim 12, wherein the" delete "wherein the".

Signed and Sealed this

Twenty-fourth Day of March, 2009

JOHN DOLL
*Acting Director of the United States Patent and Trademark Office*